US006876132B2

(12) United States Patent
Fong et al.

(10) Patent No.: US 6,876,132 B2
(45) Date of Patent: Apr. 5, 2005

(54) METHOD AND STRUCTURE FOR A SOLID SLUG CATERPILLAR PIEZOELECTRIC RELAY

(75) Inventors: Arthur Fong, Colorado Springs, CO (US); Marvin Glenn Wong, Woodland Park, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 172 days.

(21) Appl. No.: 10/413,088

(22) Filed: Apr. 14, 2003

(65) Prior Publication Data

US 2004/0201316 A1 Oct. 14, 2004

(51) Int. Cl.7 .......................... H01L 41/08; H01H 1/08; H01H 57/00

(52) U.S. Cl. .................. 310/328; 310/323.17; 200/182; 200/214; 200/215; 335/47; 335/49; 335/58

(58) Field of Search ............................ 310/328, 323.17; 200/182, 214, 215; 335/47, 49, 58

(56) References Cited

U.S. PATENT DOCUMENTS

| | | | | |
|---|---|---|---|---|
| 2,312,672 A | | 3/1943 | Pollard, Jr. | 335/58 |
| 2,564,081 A | | 8/1951 | Schilling | 335/56 |
| 3,430,020 A | * | 2/1969 | Tomkewitsch et al. | 200/181 |

(Continued)

FOREIGN PATENT DOCUMENTS

| | | |
|---|---|---|
| EP | 0593836 A1 | 10/1992 |
| FR | 2418539 A | 9/1979 |
| FR | 2458138 A1 | 10/1980 |
| FR | 2667396 | 9/1990 |
| JP | SHO 36-18575 | 10/1961 |
| JP | SHO 47-21645 | 10/1972 |
| JP | 63-276838 | 5/1987 |
| JP | 01-294317 | 5/1988 |
| JP | 08-125487 A | 5/1996 |
| JP | 9161640 A | 6/1997 |
| WO | WO 99/46624 A1 | 9/1999 |

OTHER PUBLICATIONS

Bhedwar, Homi C. et al. "Ceramic Multilayer Package Fabrication." Electronic Materials Handbook, Nov. 1989, pp. 460–469, vol. 1 Packaging, Section 4: Packages.

"Integral Power Resistors for Aluminum Substrate." IBM Technical Disclosure Bulletin, Jun. 1984, US, Jun. 1, 1984, p. 827, vol. 27, No. 1B, TDB–ACC–NO: NB8406827, Cross Reference: 0018–8689–27–1B–827.

(Continued)

*Primary Examiner*—Thomas M. Dougherty

(57) ABSTRACT

A method and structure for an electrical switch. A gas-filled chamber is housed within a solid material. Contacts within the gas-filled chamber are coupled to the solid material, while a plurality of piezoelectric elements within the gas-filled chamber are also coupled to the solid material. A slug within the gas-filled chamber is coupled to one or more of the plurality of contacts and further coupled to one or more of the plurality of piezoelectric elements. A liquid metal within the gas-filled chamber is coupled to the slug, and coupled to the plurality of contacts. One or more of the piezoelectric elements are actuated, with the actuation of the one or more piezoelectric elements causing the slug coupled to the one or more piezoelectric elements to move from a first number of contacts to a second number of contacts wherein the first number of contacts and the second number of contacts are wetted by the liquid metal. The movement of the slug from the first number of contacts to the second number of contacts breaks a liquid metal surface tension between the slug and the first number of contacts and establishes a coupling between the slug and the second number of contacts, thereby enabling the liquid metal switch to change from a first state to a second state.

34 Claims, 5 Drawing Sheets

U.S. PATENT DOCUMENTS

| | | | | | |
|---|---|---|---|---|---|
| 3,529,268 | A | | 9/1970 | Rauterberg | 335/56 |
| 3,600,537 | A | | 8/1971 | Twyford | 200/407 |
| 3,639,165 | A | | 2/1972 | Rairden, III | 428/433 |
| 3,657,647 | A | | 4/1972 | Beusman et al. | 324/94 |
| 4,103,135 | A | | 7/1978 | Gomez et al. | 200/185 |
| 4,199,739 | A | * | 4/1980 | Deith | 335/58 |
| 4,200,779 | A | * | 4/1980 | Zakurdaev et al. | 200/187 |
| 4,238,748 | A | * | 12/1980 | Goullin et al. | 335/56 |
| 4,245,886 | A | | 1/1981 | Kolodzey et al. | 385/19 |
| 4,336,570 | A | | 6/1982 | Brower | 362/4 |
| 4,419,650 | A | | 12/1983 | John | 337/119 |
| 4,434,337 | A | | 2/1984 | Becker | 200/220 |
| 4,475,033 | A | | 10/1984 | Willemsen et al. | 250/201.1 |
| 4,505,539 | A | | 3/1985 | Auracher et al. | 385/19 |
| 4,582,391 | A | | 4/1986 | Legrand | 385/17 |
| 4,628,161 | A | | 12/1986 | Thackrey | 200/61.47 |
| 4,652,710 | A | | 3/1987 | Karnowsky et al. | 200/235 |
| 4,657,339 | A | | 4/1987 | Fick | 385/22 |
| 4,742,263 | A | | 5/1988 | Harnden, Jr. et al. | 310/331 |
| 4,786,130 | A | | 11/1988 | Georgiou et al. | 385/48 |
| 4,797,519 | A | | 1/1989 | Elenbaas | 200/226 |
| 4,804,932 | A | | 2/1989 | Akanuma et al. | 335/38 |
| 4,988,157 | A | | 1/1991 | Jackel et al. | 385/17 |
| 5,278,012 | A | | 1/1994 | Yamanaka et al. | 430/30 |
| 5,415,026 | A | | 5/1995 | Ford | 73/651 |
| 5,502,781 | A | | 3/1996 | Li et al. | 385/4 |
| 5,644,676 | A | | 7/1997 | Blomberg et al. | 370/416 |
| 5,675,310 | A | | 10/1997 | Wojnarowski et al. | 338/309 |
| 5,677,823 | A | | 10/1997 | Smith | 361/234 |
| 5,751,074 | A | | 5/1998 | Prior et al. | 307/118 |
| 5,751,552 | A | | 5/1998 | Scanlan et al. | 361/707 |
| 5,828,799 | A | | 10/1998 | Donald | 385/16 |
| 5,841,686 | A | | 11/1998 | Chu et al. | 365/51 |
| 5,849,623 | A | | 12/1998 | Wojnarowski et al. | 438/382 |
| 5,874,770 | A | | 2/1999 | Saia et al. | 257/536 |
| 5,875,531 | A | | 3/1999 | Nellissen et al. | 29/25.35 |
| 5,886,407 | A | | 3/1999 | Polese et al. | 257/706 |
| 5,889,325 | A | | 3/1999 | Uchida et al. | 257/724 |
| 5,912,606 | A | | 6/1999 | Nathanson et al. | 335/47 |
| 5,915,050 | A | | 6/1999 | Russell et al. | 385/7 |
| 5,972,737 | A | | 10/1999 | Polese et al. | 438/122 |
| 5,994,750 | A | | 11/1999 | Yagi | 257/415 |
| 6,021,048 | A | | 2/2000 | Smith | 361/736 |
| 6,180,873 | B1 | | 1/2001 | Bitko | 174/9 F |
| 6,201,682 | B1 | | 3/2001 | Mooij et al. | 361/306.1 |
| 6,207,234 | B1 | | 3/2001 | Jiang | 427/333 |
| 6,212,308 | B1 | | 4/2001 | Donald | 385/16 |
| 6,225,133 | B1 | | 5/2001 | Yamamichi et al. | 438/3 |
| 6,278,541 | B1 | | 8/2001 | Baker | 359/291 |
| 6,304,450 | B1 | | 10/2001 | Dibene, II et al. | 361/704 |
| 6,320,994 | B1 | | 11/2001 | Donald et al. | 385/16 |
| 6,323,447 | B1 | | 11/2001 | Kondoh et al. | 200/182 |
| 6,351,579 | B1 | | 2/2002 | Early et al. | 385/18 |
| 6,356,679 | B1 | | 3/2002 | Kapany | 385/16 |
| 6,373,356 | B1 | | 4/2002 | Gutierrez et al. | 335/47 |
| 6,396,012 | B1 | | 5/2002 | Bloomfield | 200/233 |
| 6,396,371 | B2 | | 5/2002 | Streeter et al. | 335/78 |
| 6,408,112 | B1 | | 6/2002 | Bartels | 385/16 |
| 6,446,317 | B1 | | 9/2002 | Figueroa et al. | 29/25.42 |
| 6,453,086 | B1 | | 9/2002 | Tarazona | 385/20 |
| 6,470,106 | B2 | | 10/2002 | McClelland et al. | 385/16 |
| 6,487,333 | B2 | | 11/2002 | Fouquet | 385/18 |
| 6,501,354 | B1 | | 12/2002 | Gutierrez et al. | 335/47 |
| 6,512,322 | B1 | | 1/2003 | Fong et al. | 310/328 |
| 6,515,404 | B1 | | 2/2003 | Wong | 310/328 |
| 6,516,504 | B2 | | 2/2003 | Schaper | 29/25.42 |
| 6,559,420 | B1 | | 5/2003 | Zarev | 219/209 |
| 6,633,213 | B1 | | 10/2003 | Dove | 335/78 |
| 6,765,161 | B1 | * | 7/2004 | Wong et al. | 200/182 |
| 2002/0037128 | A1 | | 3/2002 | Burger et al. | 385/16 |
| 2002/0146197 | A1 | | 10/2002 | Yong | 385/17 |
| 2002/0150323 | A1 | | 10/2002 | Nishida et al. | 385/16 |
| 2002/0168133 | A1 | | 11/2002 | Saito | 385/16 |
| 2003/0035611 | A1 | | 2/2003 | Shi | 385/16 |
| 2003/0207102 | A1 | * | 11/2003 | Fong et al. | 428/328 |
| 2004/0201310 | A1 | * | 10/2004 | Wong et al. | 310/328 |
| 2004/0201329 | A1 | * | 10/2004 | Wong et al. | 310/365 |

OTHER PUBLICATIONS

Kim, Joonwon et al. "A Micromechanical Switch with Electrostatically Driven Liquid–Metal Droplet." Sensors and Actuators, A: Physical. v 9798, Apr. 1, 2002, 4 pages.

Jonathan Simon, "A Liquid–Filled Microrelay with a Moving Mercury Microdrop" (Sep. 1997) Journal of Microelectromechanical Systems, vol. 6, No. 3, pp208–216.

Marvin Glenn Wong, "A Piezoelectrically Actuated Liquid Metal Switch", May 1, 2002, U.S. Appl. No. 10/137,691, 12 pages of specification, 5 pages of claims, 1 page of abstract, and 10 sheets of drawings (Figs. 1–10).

* cited by examiner

METHOD AND STRUCTURE FOR A SOLID SLUG CATERPILLAR PIEZOELECTRIC RELAY

CROSS REFERENCE TO RELATED APPLICATIONS

This application is related to the following co-pending U.S. Patent Applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010531-1, "High Frequency Bending Mode Latching Relay", and having the same filing date as the present application;

Application 10010570-1, titled "Piezoelectrically Actuated Liquid Metal Switch", filed May 2, 2002 and identified by Ser. No. 10/142,076;

Application 10010571-1, "High-frequency, Liquid Metal, Latching Relay with Face Contact", and having the same filing date as the present application;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010663-1, "Method and Structure for a Pusher-Mode Piezoelectrically Actuated Liquid Metal Switch", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121-1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011437-1, "Longitudinal Electromagnetic Latching Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled "A Longitudinal Mode Solid Slug Optical Latching Relay", and having the same filing date as the present application;

Application 10020473-1, titled "Reflecting Wedge Optical Wavelength Multiplexer/Demultiplexer", and having the same filing date as the present application;

Application 10020541-1, titled "Method and Structure for a Solid Slug Caterpillar Piezoelectric Optical Relay", and having the same filing date as the present application;

Application 10030438-1, "Inserting-finger Liquid Metal Relay", and having the same filing date as the present application;

Application 10030440-1, "Wetting Finger Liquid Metal Latching Relay", and having the same filing date as the present application;

Application 10030521-1, "Pressure Actuated Optical Latching Relay", and having the same filing date as the present application;

Application 10030522-1, "Pressure Actuated Solid Slug Optical Latching Relay", and having the same filing date as the present application; and Application 10030546-1, "Method and Structure for a Slug Caterpillar Piezoelectric Reflective Optical Relay", and having the same filing date as the present application.

TECHNICAL FIELD

This invention relates generally to the field of electronic devices and systems, and more specifically to electronic switching technology.

BACKGROUND

A relay or switch may be used to change an electrical signal from a first state to a second state. In general there may be more than two states. In applications that require a small switch geometry or a large number of switches within a small region, semiconductor fabrication techniques may be used to create switches with a small footprint. A semiconductor switch may be used in a variety of applications, such as industrial equipment, telecommunications equipment and control of electro-mechanical devices such as ink jet printers.

In switching applications, the use of piezoelectric technology may be used to actuate a switch. Piezoelectric materials have several unique characteristics. A piezoelectric material can be made to expand or contract in response to an applied voltage. This is known as the indirect piezoelectric effect. The amount of expansion or contraction, the force generated by the expansion or contraction, and the amount of time between successive contractions are important material properties that influence the application of a piezoelectric material in a particular application. Piezoelectric material also exhibits a direct piezoelectric effect, in which an electric field is generated in response to an applied force. This electric field may be converted to a voltage if contacts are properly coupled to the piezoelectric material. The indirect piezoelectric effect is useful in making or breaking a contact within a switching element, while the direct piezoelectric effect is useful in generating a switching signal in response to an applied force.

SUMMARY

A method and structure for an electrical switch is disclosed. According to a structure of the present invention, a gas-filled chamber is housed within a solid material. The solid material may be composed of glass, ceramic, metals and adhesive material. A plurality of contacts within the gas-filled chamber are coupled to the solid material, while a plurality of piezoelectric elements within the gas-filled chamber are also coupled to the solid material. A slug within the gas-filled chamber is coupled to one or more of the plurality of contacts and further coupled to one or more of the plurality of piezoelectric elements. The slug is operable to move within the chamber and make or break connections with one or more of the plurality of contacts. A liquid metal within the gas-filled chamber is coupled to the slug, and coupled to the plurality of contacts. The liquid metal acts as a friction-reducing lubricant for motion of the slug, and also is operable to provide a surface tension that maintains a connection between the slug and a contact of the plurality of contacts. According to a method of the present invention, one or more of the plurality of piezoelectric elements are actuated, with the actuation of the one or more piezoelectric elements causing the slug coupled to the one or more piezoelectric elements to move from a first number of contacts to a second number of contacts. The first number of contacts and the second number of contacts are wetted by the liquid metal. The movement of the slug from the first number of contacts to the second number of contacts breaks a liquid metal surface tension between the slug and the first number of contacts and establishes a coupling between the slug and the second number of contacts, thereby enabling the liquid metal switch to change from a first state to a second state. The surface tension of the liquid metal between the slug and the second number of contacts is then operable to maintain a coupling between the second number of contacts and the slug.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
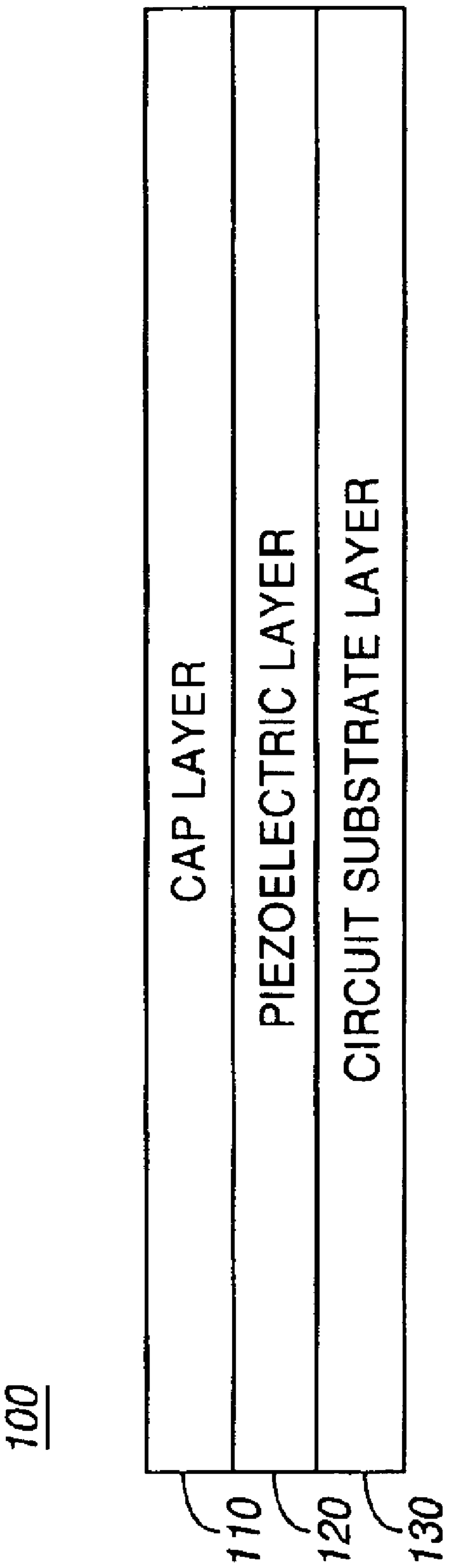
FIG. 1 is a side view of a liquid metal switch, according to certain embodiments of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

A liquid metal switch may be represented using a plurality of layers, wherein the plurality of layers represent layers created during a fabrication of the liquid metal switch. Referring now to FIG. 1, a side view of a liquid metal switch 100 is shown, according to a certain embodiment of the present invention. Cap layer 110 is shown coupled to piezoelectric layer 120, while piezoelectric layer 120 is coupled to circuit substrate layer 130. It is noted that circuit substrate layer 130 may further comprise a plurality of circuit traces, wherein the plurality of circuit traces are not shown in FIG. 1. It is further noted that additional layers may be coupled to cap layer 110, piezoelectric layer 120 and circuit substrate layer 130 without departing from the spirit and scope of the present invention. In certain embodiments of the present invention, the piezoelectric layer 120, cap layer 110, and the circuit substrate layer 130 may be composed of one or more of glass, ceramic, composite material and ceramic-coated material.

Figure 2:
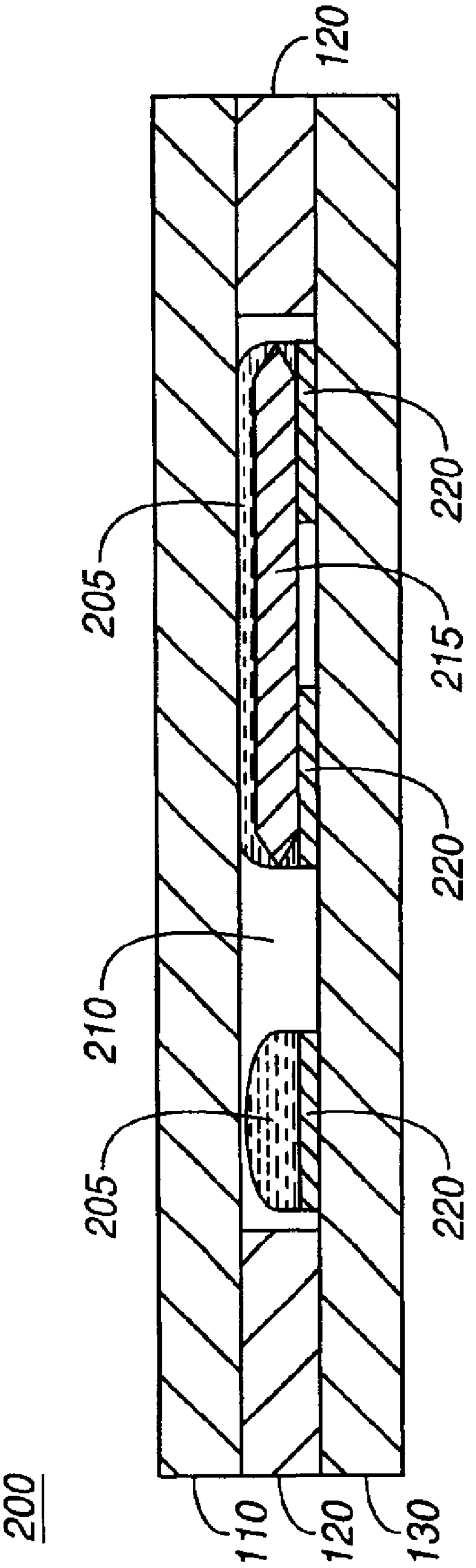
FIG. 2 is a cross section of a liquid metal switch, according to certain embodiments of the present invention.

Referring now to FIG. 2, a cross section 200 of liquid metal switch 100 is shown, according a certain embodiment of the present invention. Piezoelectric layer 120 comprises a chamber 210, wherein in a preferred embodiment of the present invention chamber 210 is located completely within piezoelectric layer 120. Chamber 210 comprises a plurality of contacts 220, liquid metal 205, and slug 215. The liquid metal 205, such as mercury or a Gallium alloy, acts as a friction-reducing lubricant. The plurality of contacts 220 are coupled to circuit substrate layer 130. Liquid metal 205 is coupled to the plurality of contacts 220, further coupled to slug 215, cap layer 110, and operable to be coupled to cap layer 110. Slug 215 is coupled to liquid metal 205 and further coupled to one or more of the plurality of contacts 220. In a certain embodiment of the present invention, slug 215 resides entirely within liquid metal 205. Slug 215 may be solid or hollow, and may be composed of a wettable material, such as metallic compounds, ceramic or plastic. It is noted that liquid metal 205 is coupled to each of the plurality of contacts 220 independent of a position of liquid metal switch 100. In a certain embodiment of the present invention, liquid metal 205 enables slug 215 to be coupled to one or more of the plurality of contacts 220.

Chamber 210 is filled with a gas, which in a certain embodiment of the present invention is inert. In a certain embodiment of the present invention, the gas is nitrogen. Slug 215 is represented in FIG. 2 as a solid material, although it is noted that slug 215 may be hollow without departing from the spirit and scope of the present invention. In a certain embodiment of the present invention, slug 215 is tapered at both longitudinal ends of said slug 215 so that slug 215 may be actuated by a movement of a piezoelectric element. The piezoelectric element may be composed from ceramic, quartz, plastic, or specially designed materials. It is also noted that although liquid metal switch 100 is shown with three contacts 220, a greater number of metal contacts may be used without departing from the spirit and scope of the present invention. The plurality of contacts 220 are chosen from a material so that plurality of contacts 220 does not interact with liquid metal 205. It is noted that in a certain embodiment of the present invention, one or more of plurality of contacts 220 are coupled to slug 215 at each time instant thereby enabling liquid metal switch 100 to switch electrical signals in a differential manner. As an example, the three contacts 220 shown in FIG. 2 are operable to provide a common contact (the center contact shown in FIG. 2) with slug 215 so that coupling slug 215 to a left contact of plurality of contacts 220 generates an electrical signal with a polarity opposite that of coupling slug 215 to a right contact of plurality of contacts 220.

Figure 3:
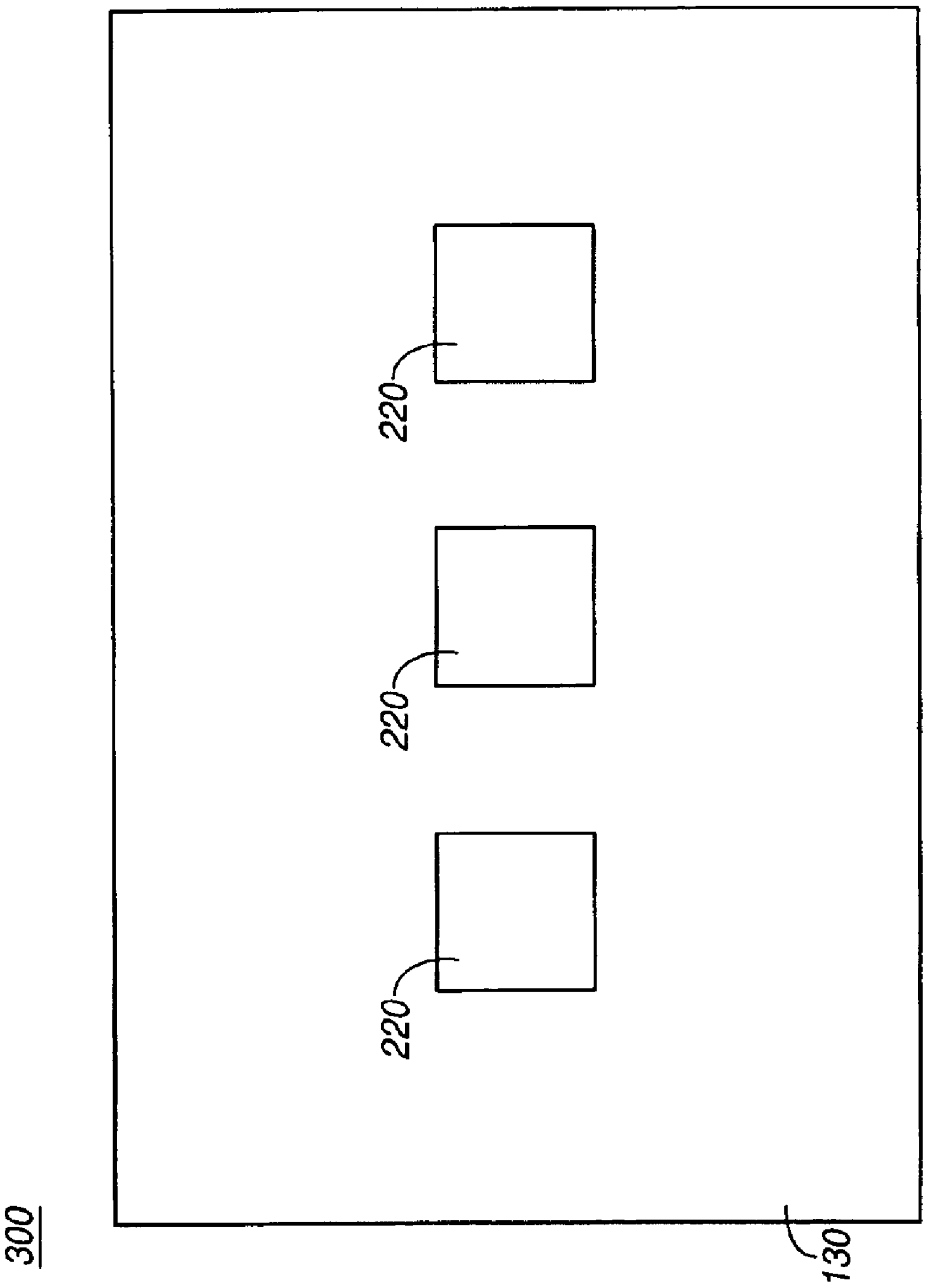
FIG. 3 is a top view of a circuit substrate layer of a liquid metal switch, according to certain embodiments of the present invention.

Referring now to FIG. 3, a top view 300 of circuit substrate layer 130 of liquid metal switch 100 is shown, according to a certain embodiment of the present invention. Plurality of contacts 220 are coupled to circuit substrate layer 130. It is noted that plurality of contacts 220 may be connected through the circuit substrate layer 130 to a plurality of solder balls on an opposite side of circuit substrate layer 130 for signal routing. In an alternative embodiment of the present invention, circuit traces and pads may be provided on the same side of circuit substrate layer 130 as plurality of contacts 200.

Figure 4:
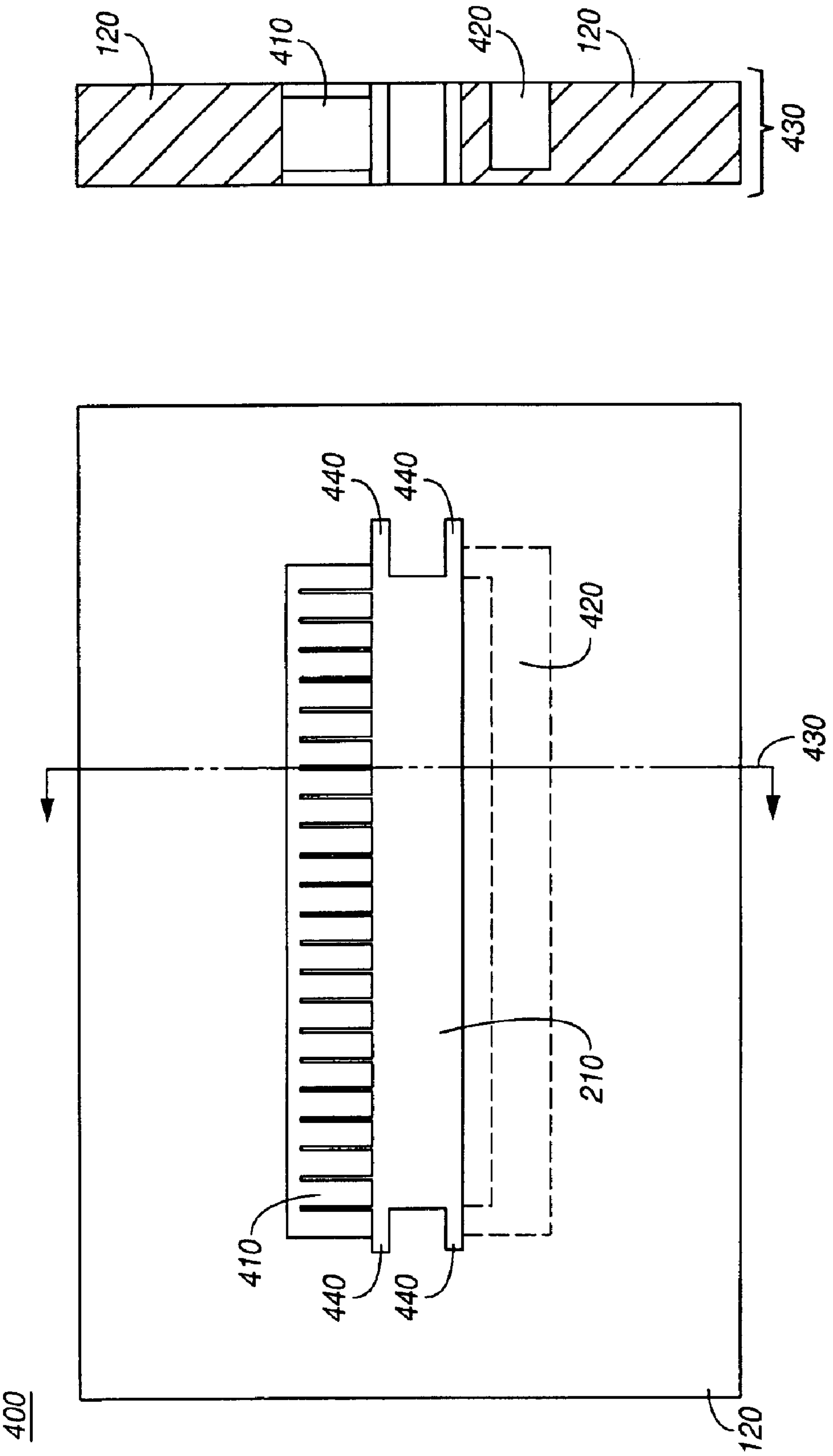
FIG. 4 is a top view of a piezoelectric layer of a liquid metal switch, according to certain embodiments of the present invention.

Referring now to FIG. 4, a top view 400 of piezoelectric layer 120 of liquid metal switch 100 is shown, according to a certain embodiment of the present invention. A top level view of piezoelectric layer 120 is shown along with a cross-section 430. Cross-section 430 illustrates a plurality of piezoelectric elements 410 coupled to piezoelectric layer 120 and further coupled to chamber 210. The plurality of piezoelectric elements 410 are oriented perpendicular to the plurality of contacts 220. A side view of vent passage 420 is also shown in cross-section 430. Vent passage 420 resides within piezoelectric layer 120, and in a certain embodiment of the present invention vent passage 420 is coupled to chamber 210 in two locations. In a certain embodiment of the present invention, the two locations are oriented so that the plurality of piezoelectric elements 410 are located between the two locations when piezoelectric layer 120 is viewed from the top. It is further noted that in a certain embodiment of the present invention, chamber 210 is fabricated so that a plurality of small channels 440 are created adjacent to the plurality of piezoelectric elements 410 and adjacent to two locations of the vent passage 420. The plurality of small channels 440 are illustrated in FIG. 4, although it is noted that a greater or fewer number of channels 440 could be used without departing from the spirit and scope of the present invention. Plurality of small channels 440 are oriented so that vent passage 420 is operable to adequately equalize a chamber pressure as slug 215 is in motion. Plurality of small channels 440 are also oriented so that plurality of piezoelectric elements 410 are able to effectively be actuated.

Plurality of piezoelectric elements 410 may be segmented as shown in FIG. 4, or one or more of the plurality of piezoelectric elements 410 may be distinct elements. If the plurality of piezoelectric elements 410 are segmented, then in a certain embodiment of the present invention plurality of piezoelectric elements 410 has a common ground while plurality of piezoelectric elements 410 may be actuated distinctly. In a certain embodiment of the present invention, one or more of the plurality of piezoelectric elements 410 are constrained on one side so that expansion of the one or more piezoelectric elements is in a single direction. The plurality of piezoelectric elements 410 may be actuated so that slug 215 moves from one subset of the plurality of contacts 220 to a second subset of the plurality of contacts 220, thereby enabling liquid metal switch 100 to change state. Actuation of a piezoelectric element of the plurality of piezoelectric elements 410 is operable to move slug 215 within chamber 210.

Successive actuations of one or more of the plurality of piezoelectric elements 410 are operable to cause slug 215 to propagate from a first end of chamber 215 to a second end of chamber 210. In a certain embodiment of the present invention, plurality of piezoelectric elements 410 are actuated one at a time with a second piezoelectric element actuated after a first piezoelectric element wherein the first piezoelectric element is adjacent to the second piezoelectric element. It is noted that the ordering of one or more actuations of one or more piezoelectric elements of the plurality of piezoelectric elements 410 may be non-adjacent without departing from the spirit and scope of the present invention. In a certain embodiment of the present invention, one or more of the plurality of piezoelectric elements 410 may be actuated in order to slow down, or dampen, a velocity of slug 215 as slug 215 propagates from the first end of chamber 215 to the second end of chamber 215. It is also noted that in a certain embodiment of the present invention, the tapered ends of slug 215 are tapered so that the plurality of piezoelectric elements 410 more efficiently impart a velocity to slug 215. In a certain embodiment of the present invention, slug 215 experiences a substantially constant velocity due to the actuation of one or more of the plurality of piezoelectric elements 410.

Figure 5:
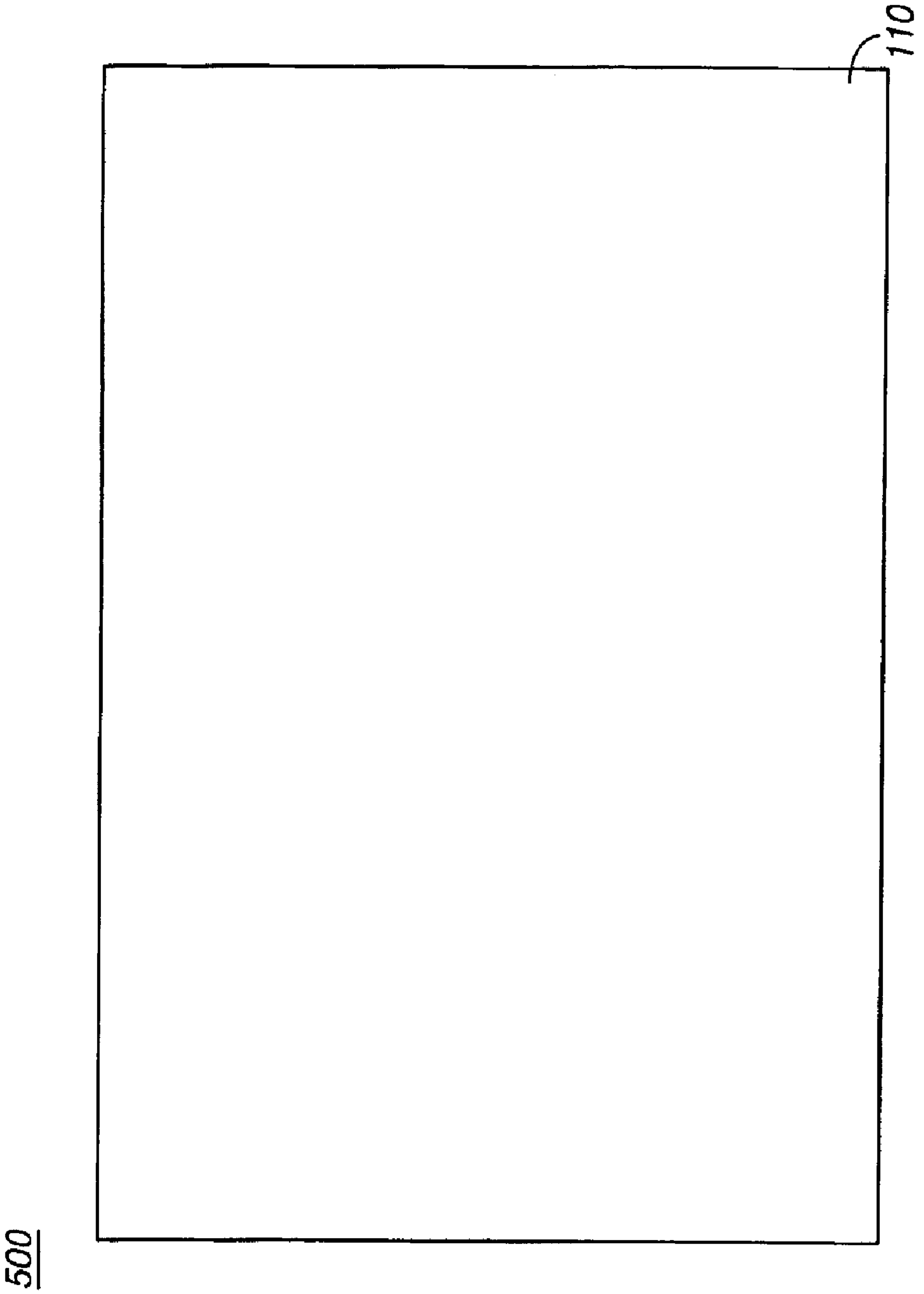
FIG. 5 is a top view of a cap layer of a liquid metal switch, according to certain embodiments of the present invention.

Referring now to FIG. 5, a top view 500 of cap layer 110 of liquid metal switch 100 is shown, according to a certain embodiment of the present invention. It is noted that cap layer 110 is fabricated from a monolithic material. In a certain embodiment of the present invention, cap layer 110 is fabricated from glass, circuit substrate layer 130 is fabricated from a ceramic, and piezoelectric layer 120 is fabricated from ceramic.

The liquid metal switch 100 operates by means of the lateral displacement of one or more of the plurality of piezoelectric elements 410 in an extension mode thereby displacing slug 215 that is wetted by a liquid metal 205 and causing the liquid metal 205 to wet between a first contact pad of the plurality of contacts 220 on the circuit substrate 130 and a second contact of the plurality of contacts 220 to close a switch contact of liquid metal switch 100. The same motion that causes the solid slug to change position can cause an electrical connection to be broken between the first contact on the substrate and the second contact. The lateral motions of the one or more piezoelectric elements squeeze the slug 215 tapered ends, thereby moving the slug 215 along a length of the chamber 210 to overcome surface tension forces that would hold the slug 215 in contact with the first contact. The liquid metal switch 100 latches by means of a surface tension due to liquid metal 205 and the liquid metal 205 wetting to the plurality of contacts 220. The slug 215 is wettable and so may be maintained in a stable position due to the surface tension of the liquid metal 205 and the coupling of the slug 215 to one or more of the plurality of contacts 220.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A structure for an electrical switch, comprising:

a gas-filled chamber housed within a solid material;

a plurality of contacts within the gas-filled chamber, wherein the plurality of contacts are coupled to the solid material;

a plurality of piezoelectric elements within the gas-filled chamber, coupled to the solid material;

a slug within the gas-filled chamber coupled to one or more of the plurality of contacts and further coupled to one or more of the plurality of piezoelectric elements; and a liquid metal coupled to the slug, and coupled to the plurality of contacts.

2. The structure of claim 1, wherein the plurality of piezoelectric elements are perpendicular to the plurality of contacts.

3. The structure of claim 1, wherein the slug is tapered at one or more ends.

4. The structure of claim 1, wherein the plurality of piezoelectric elements are segmented.

5. The structure of claim 1, wherein the plurality of piezoelectric elements are coupled to a common ground.

6. The structure of claim 1, further comprising a vent passage coupled to the gas-filled chamber, wherein the vent passage comprises one or more vent couplings to the gas-filled chamber.

7. The structure of claim 6, wherein the one or more vent couplings are oriented so that the plurality of piezoelectric elements are located between a first vent coupling of the one or more vent couplings and a second vent coupling of the one or more vent couplings.

8. The structure of claim 1, wherein the chamber is filled with an inert gas.

9. The structure of claim 8, wherein the gas is nitrogen.

10. The structure of claim 1, wherein the chamber further comprises one or more channels.

11. The structure of claim 10, wherein the one or more channels have the same orientation as the chamber.

12. The structure of claim 10, wherein one or more of the one or more channels are located adjacent to the one or more locations where the vent passage is coupled to the chamber.

13. The structure of claim 10, wherein one or more of the one or more channels are located at one or more ends of the plurality of piezoelectric elements.

14. The structure of claim 1, wherein the liquid metal is mercury.

15. The structure of claim 1, wherein the slug stays within a volume of the liquid metal during the actuation of one or more of the plurality of piezoelectric elements.

16. A structure for an electrical switch using a plurality of piezoelectric elements, comprising:

a cap layer;

a piezoelectric layer coupled to the cap layer;

a circuit substrate layer coupled to the piezoelectric layer; and a gas-filled chamber coupled to one or more of the piezoelectric layer, cap layer and circuit substrate layer, wherein the gas-filled chamber further comprises the plurality of piezoelectric elements, a plurality of contacts, a slug coupled to one or more of the plurality of contacts and coupled to one or more of the plurality of piezoelectric elements, and a liquid metal coupled to the slug, and coupled to the plurality of contacts.

17. The structure of claim 16, wherein the cap layer, circuit substrate layer, piezoelectric layer may be composed of one or more of glass, ceramic, composite material and ceramic-coated material.

18. The structure of claim 16, further comprising a vent passage coupled to the gas-filled chamber, wherein the vent passage comprises one or more vent couplings to the gas-filled chamber.

19. The structure of claim 18, wherein the one or more vent couplings are oriented so that the plurality of piezoelectric elements are located between a first vent coupling of the one or more vent couplings and a second vent coupling of the one or more vent couplings.

20. The structure of claim 16, wherein the circuit substrate layer further comprises a plurality of circuit traces and a plurality of pads operable to route one or more signals generated by actuation of one or more of the plurality of piezoelectric elements.

21. The structure of claim 16, wherein the chamber is filled with an inert gas.

22. The structure of claim 16, wherein the chamber further comprises one or more channels.

23. The structure of claim 22, wherein one or more of the one or more channels are located at one or more ends of the plurality of piezoelectric elements.

24. The structure of claim 16, wherein the slug stays within a volume of the liquid metal during the actuation of one or more of the plurality of piezoelectric elements.

25. A method for electrical switching of one or more electrical signals using a liquid metal switch, comprising:

actuating one or more of a plurality of piezoelectric elements;

the actuation of the one or more piezoelectric elements causing a slug coupled to the one or more piezoelectric elements to move from a first number of contacts to a second number of contacts wherein the first number of contacts and the second number of contacts are wetted by a liquid metal; and the movement of the slug from the first number of contacts to the second number of contacts breaking a liquid metal surface tension between the slug and the first number of contacts and establishing a coupling between the slug and the second number of contacts, thereby enabling the liquid metal switch to change from a first state to a second state.

26. The method of claim 25, wherein the slug is wetted by the liquid metal.

27. The method of claim 25, wherein the coupling between the slug and the second number of contacts is due to a plurality of surface tension forces caused by the liquid metal.

28. The method of claim 25, wherein the one or more piezoelectric elements have substantially equivalent actuation properties.

29. The method of claim 25, wherein one or more of the first number of contacts and one or more of the second number of contacts are the same.

30. The method of claim 25, wherein the liquid metal is separable into one or more volumes within the chamber.

31. The method of claim 25, wherein one or more of the one or more volumes of liquid metal are coupled to the one or more contacts.

32. The method of claim 25, wherein actuating one or more of the plurality of piezoelectric elements is operable to reduce a velocity of the slug.

33. The method of claim 25, wherein the one or more piezoelectric elements are located at an end of the chamber.

34. The method of claim 25, wherein the plurality of piezoelectric elements are actuated in an adjacent manner.

* * * * *